United States Patent [19]
Kozono

[11] Patent Number: 5,420,459
[45] Date of Patent: May 30, 1995

[54] RESIN ENCAPSULATION TYPE SEMICONDUCTOR DEVICE HAVING AN IMPROVED LEAD CONFIGURATION

[75] Inventor: Hiroyuki Kozono, Oomiya, Japan

[73] Assignee: Kabushiki Kaisha Toshiba, Kawasaki, Japan

[21] Appl. No.: 140,325

[22] Filed: Oct. 22, 1993

[30] Foreign Application Priority Data

Dec. 22, 1992 [JP] Japan .................. 4-341816

[51] Int. Cl.⁶ .......................... H01L 23/48
[52] U.S. Cl. ................. 257/666; 257/673; 257/691
[58] Field of Search .............. 257/666, 673, 691, 676, 257/692

[56] References Cited

U.S. PATENT DOCUMENTS

| | | | |
|---|---|---|---|
| 4,680,613 | 7/1987 | Daniels et al. | 257/691 |
| 4,862,246 | 8/1989 | Masuda et al. | 257/666 |
| 4,942,452 | 7/1990 | Kitano et al. | 257/666 |
| 5,084,753 | 1/1992 | Goida et al. | 257/666 |
| 5,089,878 | 2/1992 | Lee | 257/666 |
| 5,126,823 | 6/1992 | Otsuka et al. | 257/666 |
| 5,196,725 | 3/1993 | Mita et al. | 257/666 |
| 5,220,195 | 6/1993 | McShane et al. | 257/666 |
| 5,281,849 | 1/1994 | Singh Deo et al. | 257/666 |
| 5,283,717 | 2/1994 | Hundt | 257/666 |
| 5,294,902 | 3/1994 | Pannenborg et al. | 335/35 |
| 5,331,200 | 7/1994 | Teo et al. | 257/691 |

FOREIGN PATENT DOCUMENTS

| | | | |
|---|---|---|---|
| 58-18949 | 2/1983 | Japan | 257/673 |
| 4-290259 | 10/1992 | Japan | 257/691 |

Primary Examiner—Andrew J. James
Assistant Examiner—Courtney A. Bowers
Attorney, Agent, or Firm—Finnegan, Henderson, Farabow, Garrett & Dunner

[57] ABSTRACT

A resin encapsulation type semiconductor device is provided with first leads electrically connected to the signal terminals of a semiconductor element and plate-like conductor elements electrically connected to the power source terminals of the semiconductor element. The first leads and the plate-like conductor elements are arranged in parallel with each other to form a two-layer structure. The number of the leads of the semiconductor element of the invented semiconductor device is reduced from that of the leads of the conventional semiconductor device. At least one through hole is formed in each of the plate-like conductor elements in a power source lead frame so as to make the flow distribution more uniform than in the plate-like conductor elements without the through holes.

13 Claims, 7 Drawing Sheets

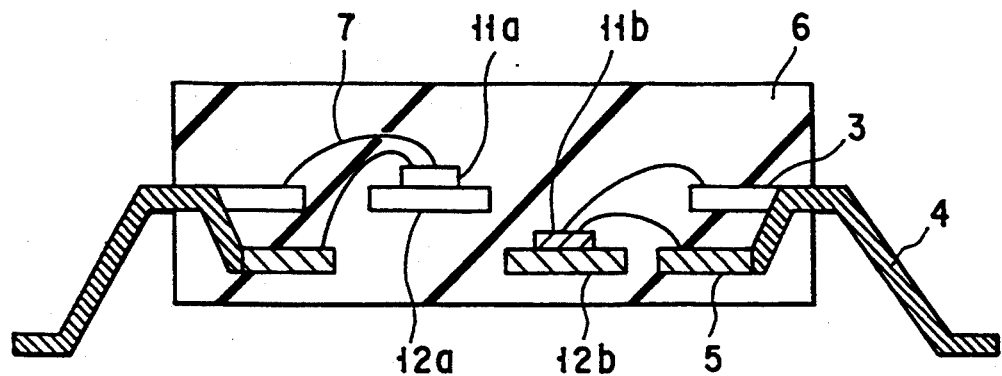
F I G. 8
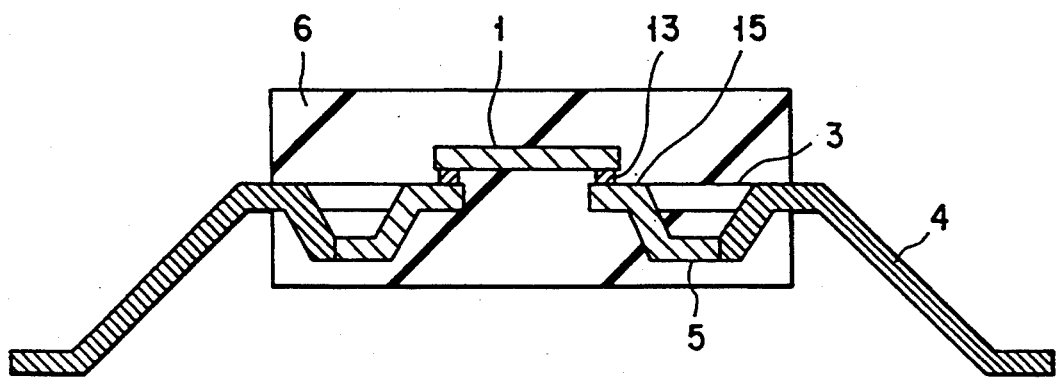
F I G. 9
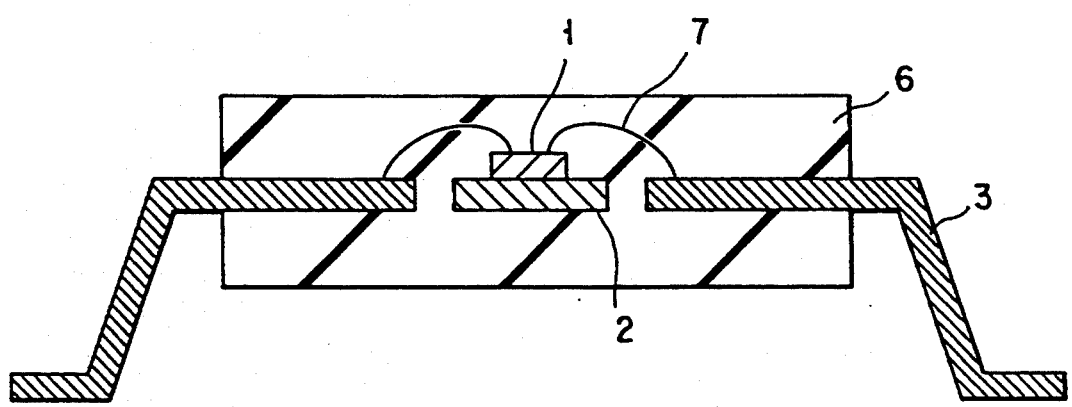
F I G. 10

RESIN ENCAPSULATION TYPE SEMICONDUCTOR DEVICE HAVING AN IMPROVED LEAD CONFIGURATION

BACKGROUND OF THE INVENTION

1. Field of the Invention

The present invention relates to a resin encapsulation type semiconductor device, and more particularly to a resin encapsulation type semiconductor device used in a high frequency field.

2. Description of the Related Art

FIG. 10 is a cross sectional view of a conventional resin encapsulation type semiconductor device. As shown in FIG. 10, a semiconductor element 1 is mounted on a semiconductor mount 2. The semiconductor element 1 is electrically connected to lead portions 3 by wires 7. The semiconductor element 1, the semiconductor mount 2, the wires 7 and a part of each lead portion 3 are encapsulated with a resin portion 6.

FIG. 11 is a plan view of the lead frame of the resin encapsulation type semiconductor device shown in FIG. 10. It will be described how to manufacture the resin encapsulation type semiconductor device with reference to FIG. 11. In the first step, a rectangular thin metal plate is punched or etched to form a lead frame 9 comprising the semiconductor mount 2, the lead portions 3' and tie bars 8. Then, the semiconductor element 1 is mounted on the semiconductor mount 2 and joined to the lead portions 3 by the wires 7. Further, the semiconductor element 1, the semiconductor mount 2, and that region of each lead portion 3 which is positioned inward of the corresponding tie bar 8, i.e., on the side of the semiconductor element 1 are encapsulated with resin, with the other region of the lead portion 3, which is positioned outward of the tie bar 8, being exposed to the outside. Under this condition, the tie bars 8 for joining adjacent lead portions 3 each other are cut away, and then the lead portions 3 are bent. As a result, the end portion of the lead portion 3 away from the semiconductor element 1 is shaped as shown in FIG. 10.

In operating the semiconductor element included in the resin encapsulation type semiconductor device of the construction described above, it is necessary in some cases to apply a high frequency of at least several hundred kHz to the semiconductor element. In this case, the leads 3 connected to the power source terminals of the semiconductor element and the leads connected to the terminals of the signal system are alternately arranged in order to suppress signal reflection or noise generation.

In the conventional arrangement described above, however, the number of leads required is about twice as large as the number of kinds of the signals, making it necessary to enlarge the planar area on which these leads are arranged. Where the planar area on which the leads are arranged is enlarged while maintaining a predetermined distance between adjacent leads and a predetermined thickness of the lead, it is necessary to increase the length of the respective lead. If the length of the lead is increased, the transmission delay time within the package is increased. Also, the unevenness in the lead length and the edge surface in the processing tends to make it impossible to obtain an optimum value (50 Ω) of the characteristic impedance for suppressing the signal reflection. On the other hand, if the distance between adjacent leads connected to the power source terminal is decreased, the inductance component is enlarged so as to bring about fluctuation in current.

SUMMARY OF THE INVENTION

An object of the present invention is to provide a resin encapsulation type semiconductor device which prevents the area of the resin encapsulated portion from being increased and is used at high frequencies.

According to the present invention, there is provided a resin encapsulation type semiconductor device, comprising:

at least one plate-like semiconductor element provided on one surface thereof with a plurality of signal terminals to which signals are supplied and a plurality of power source terminals;

a plurality of first leads electrically connected to the signal terminals of the semiconductor element, provided on a plane which is flush or parallel with the surface of the semiconductor element, and extending outward from the semiconductor element;

a plate-like conductor element electrically connected to the power source terminals of the semiconductor element, provided on a plane which is flush or parallel with the surface of the semiconductor element, and electrically insulated from the first leads;

a plurality of second leads connected to the plate-like conductor element and provided on a plane which is flush or parallel with the surface of the semiconductor elements; and a resin portion encapsulating the semiconductor element and the plate-like conductor elements and also the first and second leads except for a part of an end of each of the first and second leads which end is remoter from the semiconductor element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a cross-sectional view of a resin encapsulation type semiconductor device according to a third embodiment of the present invention;

FIG. 9 is a cross-sectional view of a resin encapsulation type semiconductor device according to a fourth embodiment of the present invention;

FIG. 10 is a cross-sectional view of a conventional resin encapsulation type semiconductor device.

DETAILED DESCRIPTION OF THE PREFERRED EMBODIMENTS

The embodiments of the present invention will be described with reference to the accompanying drawings.

Figure 1:
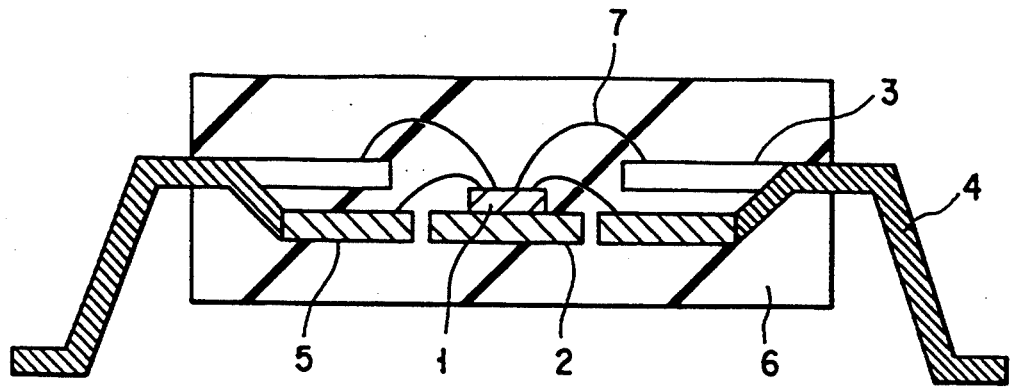
FIG. 1 is a cross-sectional view of a resin encapsulation type semiconductor device according to a first embodiment of the present invention.
Figure 2:
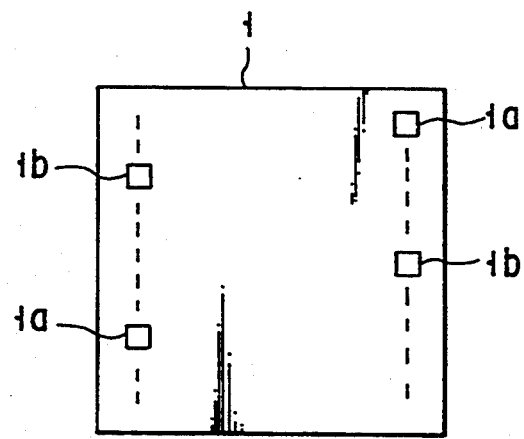
FIG. 2 is a plan view of a semiconductor element of the resin encapsulation type semiconductor device shown in FIG. 1.

FIG. 1 is a cross-sectional view of a resin encapsulation type semiconductor device according to a first embodiment of the present invention. FIG. 2 is a plane view of a semiconductor element of the resin encapsulation type semiconductor device shown in FIG. 1. On a rectangular plate-like semiconductor mount 2 is provided a semiconductor element 1 having terminals of a signal system 1a (hereinafter referred to as the "signal terminals 1a") and sources of a power source 1b (hereinafter referred as the "power source terminals 1b"). Each signal terminal 1a of the semiconductor element 1 is electrically connected by a wire 7 to a respective lead portion 3 which is parallel with the semiconductor mount 2. Each power source terminal 1b is electrically connected by a wire 7 to a respective plate-like conductor element 5 which is flush with the semiconductor mount 2. A second lead portion 4 is formed on that end of each conductor element 5 which is farther from the semiconductor mount 2. The whole of the semiconductor element 1, the semiconductor mount 2, the plate-like conductor element 5 and the wires 7, and those end portions of the first and second leads 3 and 4 which are closer to the semiconductor element 1 are covered with resin portion 6. The second leads 4 are bent. These portions of the first and second leads 3 and 4 which are outside of the resin material 6 are at the same level or flush with each other.

Figure 3:
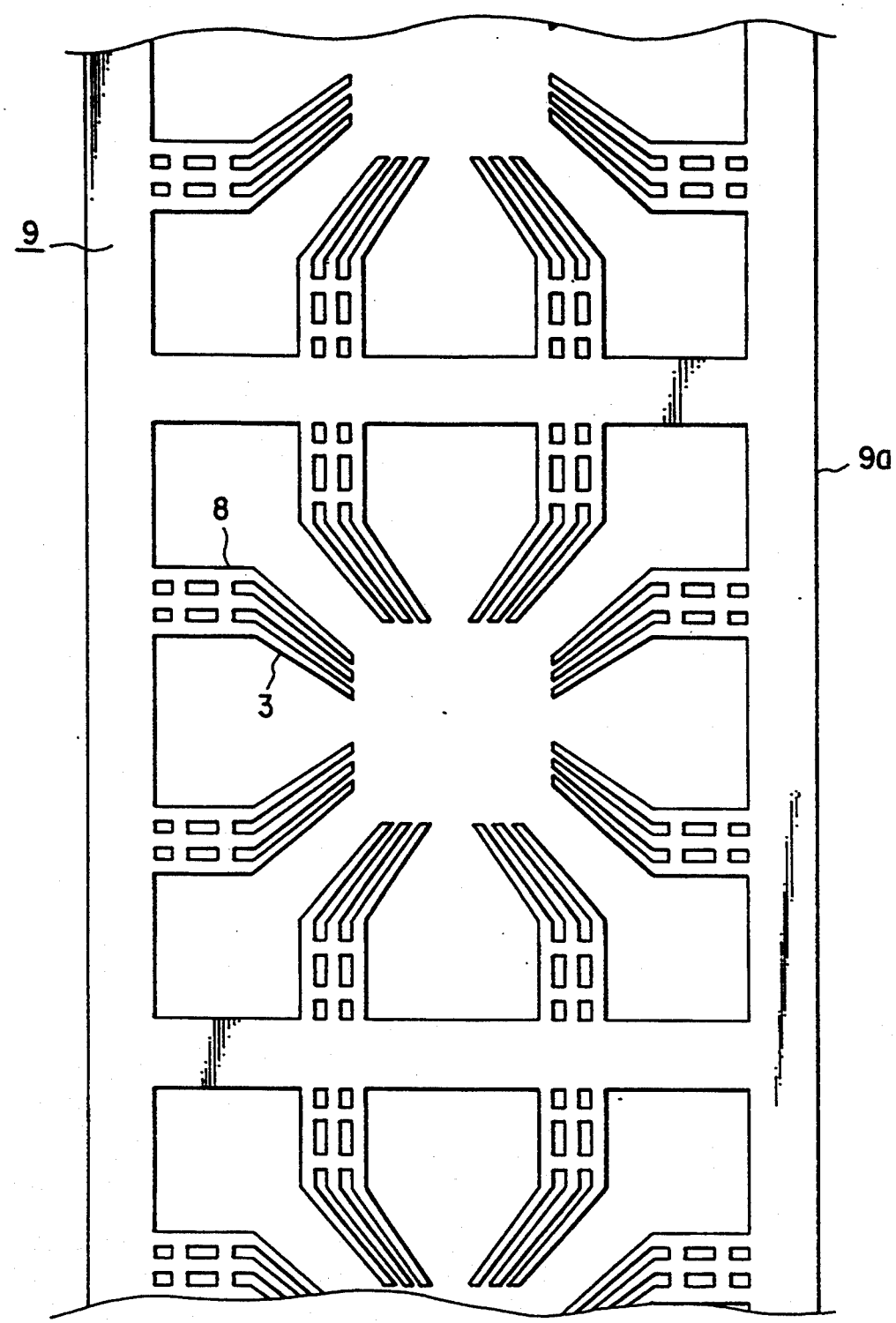
FIG. 3 is a plan view of a first lead frame of the resin encapsulation type semiconductor device according to the first embodiment of the present invention.
Figure 4:
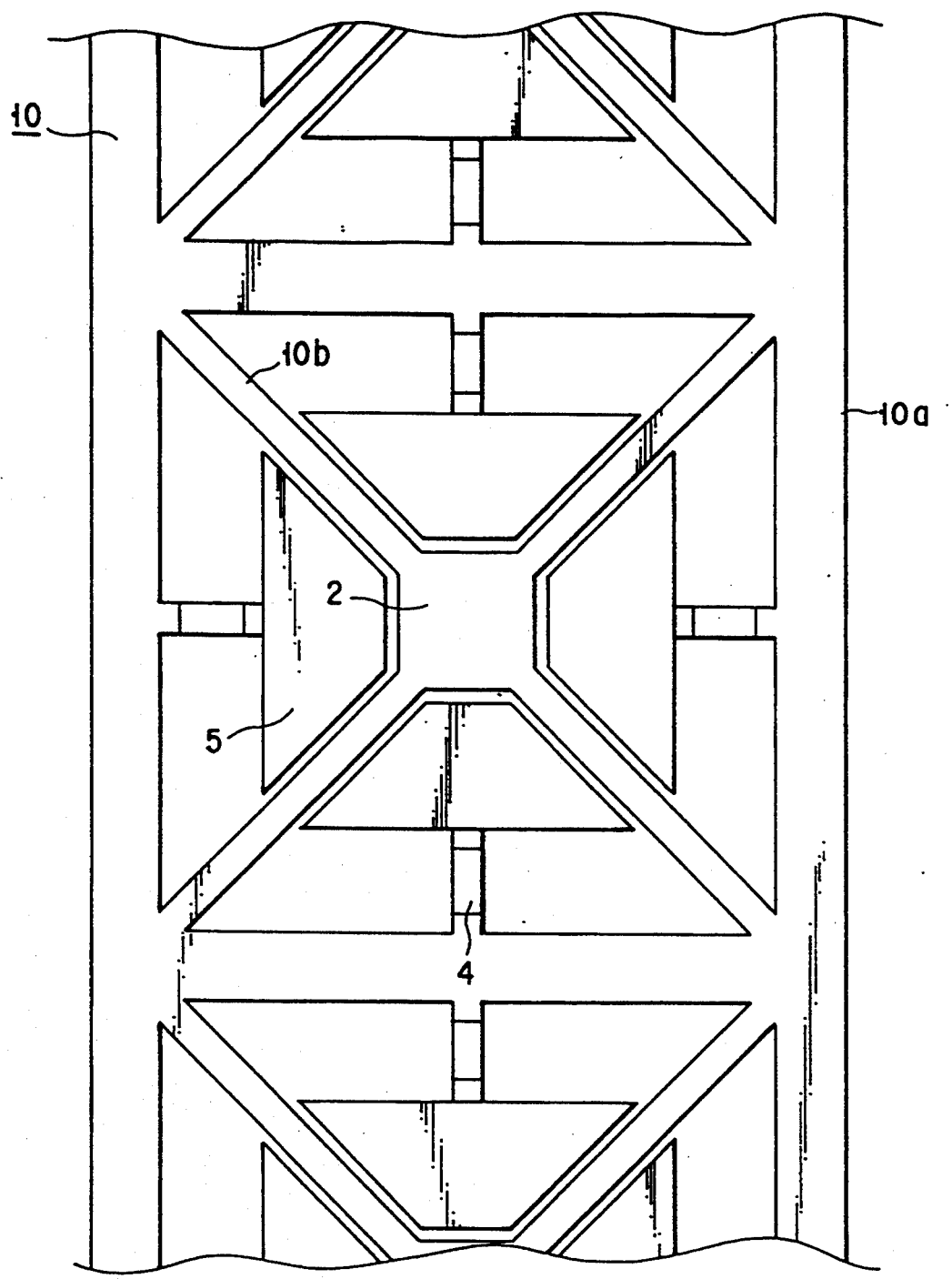
FIG. 4 is a plan view of a second lead frame of the resin encapsulation type semiconductor device according to the first embodiment of the present invention.
Figure 5:
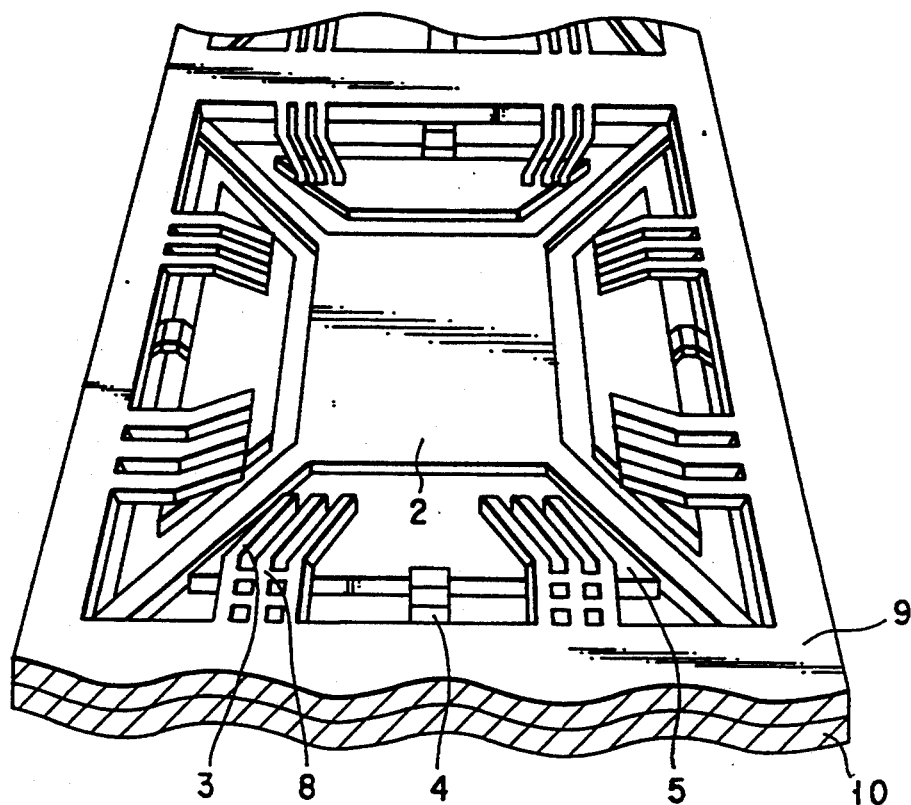
FIG. 5 is a perspective view of the laminated lead frames of the first embodiment of this invention.

FIG. 3 is a plan view of a first lead frame of the resin encapsulation type semiconductor device according to the present invention, and FIG. 4 is a plan view of second lead frame thereof. FIG. 5 is a perspective view of the laminated first and second lead frames. The manufacturing processes of the resin encapsulation type semiconductor device will be explained with reference to these figures.

As shown in FIGS. 3 and 4, a first lead frame 9 and a second lead frame 10 are formed by punching or etching thin metal plates.

The proximal end of each first lead portion 3 connected to the respective signal terminal 1a is provided on the outer peripheral portion 9a of the first lead frame 9. The distal ends of the first lead portions 3 extend radially inward. Adjacent first lead portions 3 are connected together by tie bars 8 for preventing resin from flowing out upon encapsulating resin. One end of each of four supporting portions 10b is connected to the outer peripheral portion 10a of the second lead frame 10. The other end of each of four supporting portions 10b is disposed inside of the outer peripheral portion 10a. To these other ends is connected the semiconductor mount 2 which is a rectangular plate having the semiconductor element 1 mounted thereon. In other words, the semiconductor element 1 is supported by the four supporting portions 10b extending from the four corners of the rectangular plate to the outer peripheral portion 10a of the second lead frame 10.

One end of each second lead portion 4 which end is formed by bending is connected to the outer peripheral portion 10a of the second lead frame 10. To the other end of each second lead portion 4 is joined the corresponding plate-like conductor element 5 electrically connected to the power source terminals 1b of the semiconductor element 1, in such a manner that the plate-like conductor element 5 is supported by the second lead portion 4. The semiconductor mount 2 is surrounded by four plate-like conductor members 5, with a space being left between the semiconductor mount 2 and the four plate-like conductor members 5. The plate-like conductor members 5 are surrounded by the outer peripheral portion 10a of the second lead frame 10. Thus, each conductor element 5 has a trapezoidal shape as viewed from the top. Since the plate-like conductor element 5 is designed to have a large area so as to reduce a resistance of the conductor element 5, it is preferred that the area of the conductor element 5 be as large as possible.

As shown in FIG. 5, the first lead frame 9 is thereafter placed on the second lead frame 10 such that the first lead portions 3 and the plate-like conductor members 5 form a two-layer structure and the first lead portions 3 and the second lead portions 4 are flush with each other at the outside of the plate-like conductor member 5. Since the outer leads of the present invention is preferred to be handled similarly to those of the conventional resin encapsulation type semiconductor device, the outer leads connected to the signal terminals 1a and the outer leads connected to the power source terminals 1b are arranged flush with each other. In this case, the distance between the outer leads is made small. Thus, the layer space of each two-layered inner lead and the width between the adjacent inner layers must be set so as to prevent remarkable signal reflection and noise generation.

Upon laminating, the first lead frame 9 is not bonded to the second lead frame 10 by a chemical adhesive but is only placed thereon.

Next, as shown in FIG. 1, the semiconductor element 1 is mounted on the semiconductor mount 2 in the lead frame 10. The signal terminals 1a of the semiconductor element 1 are wire-bonded to the first lead portions 3, and the power source terminals 1b of the semiconductor 1 are wire-bonded to the plate-like conductor members 5. The whole of the semiconductor element 1, the semiconductor mount 2, the wires 7 and the plate-like conductor elements 5, and end portions of the first and second leads 3 and 4, which end portions are closer to the respective semiconductor elements 1, are encapsulated by the resin portion 6. Thereafter, the tie bars 8 for connecting the ends of the first lead portions 3, which ends are farther from the semiconductor elements 1, to the outer peripheral portion 9a of the first lead frame 9 are cut off. The lead portions 3 are bent.

According to the first embodiment, the lead frames comprises two lead frames, one being a signal lead frame and the other being a power source lead frame. The first and second frames 9 and 10 are laminated on each other such that the signal lead portions 3 and the plate-like conductor members 5 connected to the power source are arranged parallel with each other to form a two-layer structure. Thus, the semiconductor device of this embodiment requires only the same number of leads 5 as the external terminals, which number is much less than that of the leads of the conventional semiconductor device. This renders the semiconductor device small in size. The length of each signal lead is lessened so as to shorten the transfer delay time. The two-layer structure of the combined lead frames facilitates optimizing the specific impedances for suppressing the signal reflection. As the area of the plate-like conductor members connected to the power source terminals of the semiconductor element can be made larger than the area of the conventional inner leads, the resistance components of the leads can be made small.

Since the second lead portions 4 are bent, the first lead portions 3 and the second leads 4 can be arranged flush with each other at the outside of the resin body 6. In other words, the outer leads can be shaped such that signal outer leads are flush with the outer leads of the power source. The completed resin encapsulation type semiconductor device of the present invention can be mounted on a substrate similarly to the conventional case.

In the first embodiment of this invention, the first and second lead frames 9 and 10 are not fixed together by a chemical agent when they are laminated, but may be adhered to each other so as to make the handling easy.

Each semiconductor mount 2 is supported on the second lead frame 10 by means of the four supporting portions 10b but may be supported on the first lead frame 9.

The bending is performed on the second lead portions 4 but can be performed on the first lead portions 3.

Since it is important that the first lead portions 3 and the plate-like conductor members 5 form a two-layer structure, the similar effects can be obtained if the first lead frame 9 overlaps the second lead frame 10 or vice versa, as long as the leads can be properly electrically connected to the signal terminals 1a and the power source terminals 1b.

Figure 6:
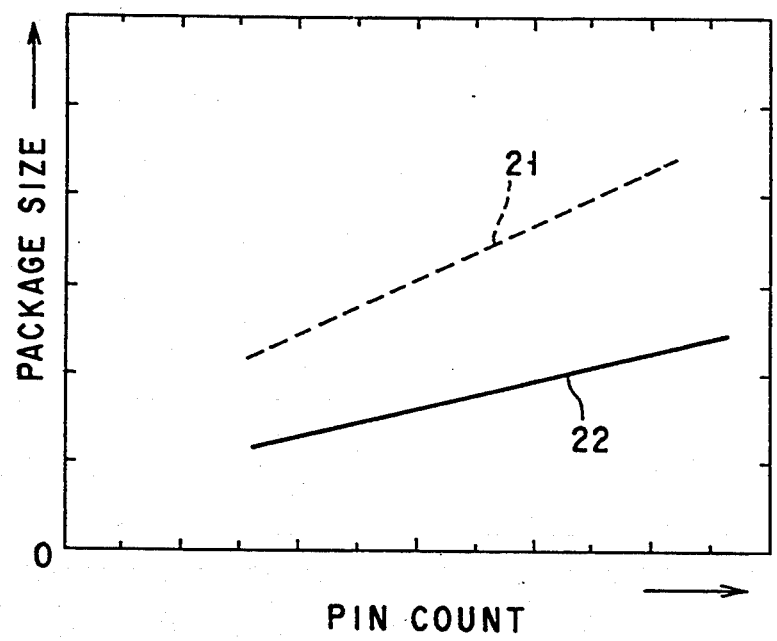
FIG. 6 is a graph showing the relation between package sizes and the number of connecting terminals.

FIG. 6 is a graph showing the relationships between package sizes and the number of connecting terminals of the present invention and the conventional art. A line 21 designates the relationship between the package size and the connecting terminals of the conventional resin encapsulation type semiconductor device. On the other hand, a line 22 shows the relationship between the package size and the connecting terminals of the resin encapsulation type semiconductor device according to the present invention. As seen from FIG. 6, the package size can be rendered small and the number of the connecting terminals is reduced in the present invention as compared with those of the conventional semiconductor device.

Figure 7:
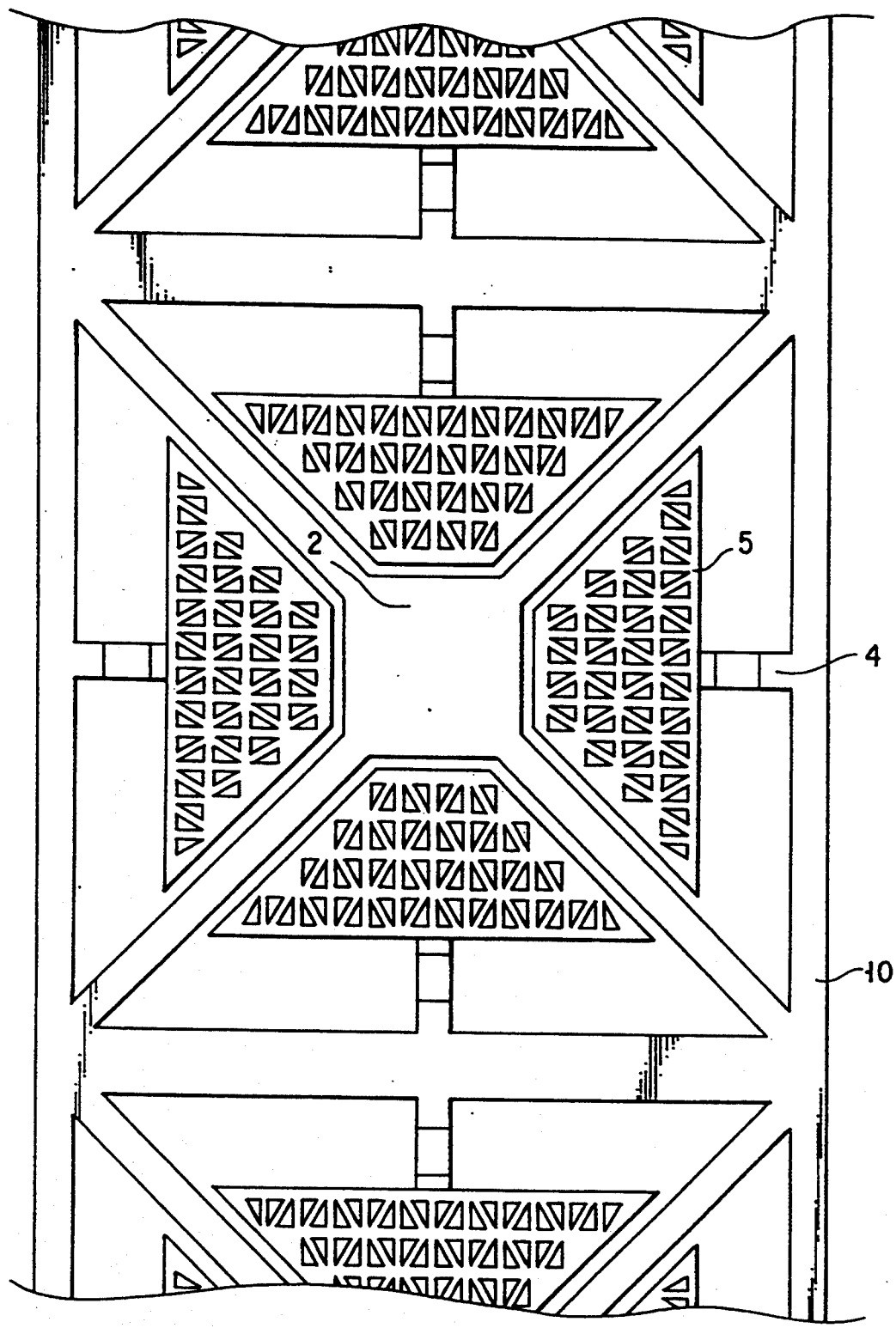
FIG. 7 is a plan view of a second lead frame of a resin encapsulation type semiconductor device according to a second embodiment of the present invention.
Figure 11:
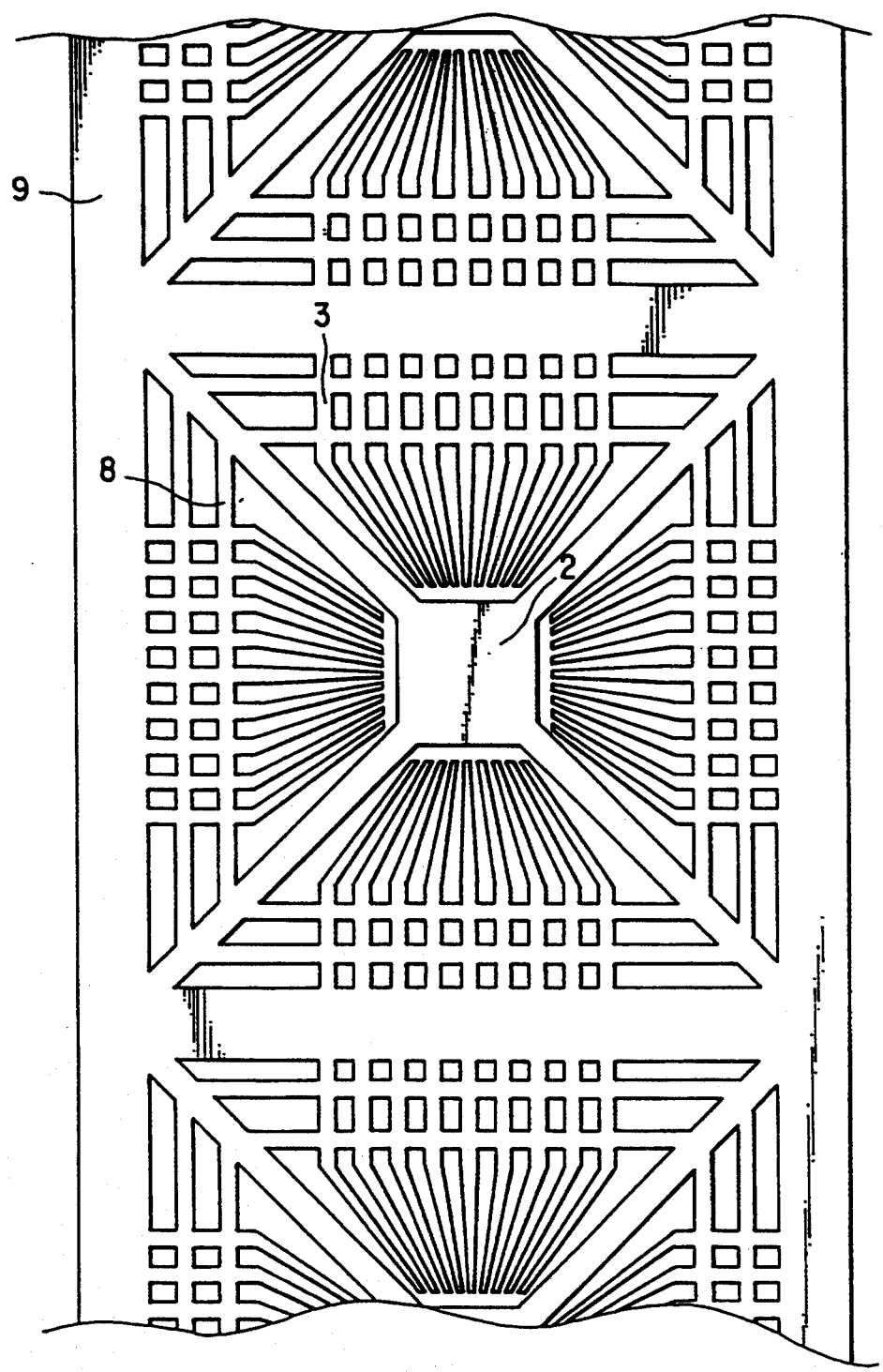
FIG. 11 is a plane view of a lead frame of the resin encapsulation type semiconductor device shown in FIG. 10.

FIG. 7 is a plan view of the second lead frame 10 in the resin encapsulation type semiconductor device according to a second embodiment of the present invention. The second lead frame 10 is formed by punching out through holes so as to form matrix-structured conductor elements 5. The other manufacturing processes are the same as those of the first embodiment.

The second embodiment attains the same effects as the first embodiment does. Since the plate-like conductor element 5 is punched to form a matrix structure, a current does not flow linearly between wire contacts (not shown) electrically connected to the plate-like conductor element 5 and the second lead portion 4 but flows in a zig-zag fashion, thereby enabling the current density between the wire contact and the second lead 4 to be controlled. This can reduce the inductance component between the wire contact and the second lead portion 4.

In the second embodiment, the plate-like conductor element 5 is punched to form a matrix structure, but may be punched to form a circular structure or any other structure as long as the structure prevents a linear flow of the current and can control the current density.

FIG. 8 is a cross-sectional view of the resin encapsulation type semiconductor device, mounted with a plurality of semiconductor elements, according to a third embodiment of the present invention. The same parts of the resin encapsulation type semiconductor device shown in FIG. 8 as those of device in FIG. 1 are designated by the same reference numerals.

A first semiconductor mount 12a and a first lead portions 3 are arranged at the same level. A first semiconductor element 11a is mounted on the first semiconductor mount 12a. A second semiconductor mount 12b and a plate-like conductor elements 5 are placed flush with each other and arranged in parallel with the first semiconductor mount 12a and the first lead portions 5. The second semiconductor element 11b is mounted on the second semiconductor mount 12b.

The signal terminals of the first and second semiconductor elements 11a and 11b are electrically connected to the first lead portions 3 by wires 7. The power source terminals of the first and second semiconductor elements 11a and 11b are electrically connected to the plate-like conductor members 5 by wires 7. A second lead portion 4 is formed on the end of each plate-like conductor element 5 which end is farther from the second semiconductor mount 12b. The whole of the first and second semiconductor elements 11a and 11b, the first and second semiconductor mounts 12a and 12b, the plate-like conductor members 5 and the wires 7, and the end portions of the first and second lead portions 3, 4 which end portions are closer to the first and second conductor elements 11a and 11b are covered with a resin portion 6. The second lead portions 4 are bent. Parts of the first lead portions 3 and the second lead portions are flush with each other.

In the manufacturing processes of the resin encapsulation type semiconductor device according to the above-described third embodiments, the first and second semiconductor elements 11a and 11b are loaded by using the first and second lead frames (not shown). The first lead frame supports the first semiconductor mounts 12a and the first lead portions 3, and the second lead frame supports the plate-like conductor members 5, the second semiconductor mounts 12a and the second lead portions 4.

The device of the third embodiment can attain the same effects as the device of the first embodiment. Since a plurality of semiconductor elements are arranged at different levels, the semiconductor elements generating much heat can be disposed separately from other semiconductor elements. When multi-chips are required, therefore, adverse effects between the semiconductor elements can be reduced as compared with the conventional case. When semiconductors generating particularly much heat are used, the semiconductor mounts 2 and 12 can be exposed from the upper surface of the resin portion to the atmosphere.

In the third embodiment, the two semiconductor elements 2 and 12 are used, but more than two semiconductor elements can be employed when their size and/or shape are modified properly. This arrangement is suited for manufacturing many kinds of chips when multi-chips are required and quickening their development.

FIG. 9 is a cross-sectional view of a flip-chip type resin semiconductor encapsulation type semiconductor device according to a fourth embodiment of the present invention. The same parts of this embodiment as those of the first embodiment are designated by the same reference numerals, and only different parts thereof will be described.

No semiconductor mount is formed on the second lead frame. A plurality of notches are formed in the portion of each plate-like conductor element 5 of the second lead frame which portion is in contact with the power source terminal of a semiconductor element 1. The notched portions are bent such that connecting portions 15 are formed on the plate-like conductor element 5. The connecting portions 15 are flush with the first lead portions 3 of the first lead frame. The signal terminals of semiconductor element 1 are connected to the first lead portions 3 by bumps 13. The power source terminals of the semiconductor element 1 are connected to the connecting portions 1 by bumps 13.

In the embodiment, the connecting portions 15 of the plate-like conductor element 5 are flush with the first lead portions 3. Thus, the terminals of the semiconductor element 1 are electrically connected to the plate-like conductor element 5 and the first lead portions 3 not by the wires but by the bumps. This structure, therefore, eliminates a wire bonding process, making it unnecessary to consider electrical variations of resistances and electrical variations between the wires and the terminals and between the wires and the leads. In this connection, highly efficient resin encapsulation type semiconductor devices can be provided.

Since the resin encapsulation type semiconductor device according to this embodiment does not have semiconductor mounts, the area of the power source lead portions can be made larger. The use of the region, on which the semiconductor mount are mounted, as the region of plate-like conductor elements 5, allows the area occupied by the elements 5 to be widened. As a result, the resistance components of the plate-like conductor elements 5 can be made small.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A resin encapsulation type semiconductor device, comprising:
   at least one semiconductor element having a surface and a plurality of signal terminals and a plurality of power source terminals on the surface;
   a plurality of first leads electrically connected to the signal terminals of the at least one semiconductor element, each first lead having a first end portion parallel to the surface of the at least one semiconductor element and a second end portion opposite the first end portion;
   a plurality of second leads electrically connected to the power source terminals of the at least one semiconductor element, each second lead having a first end portion proximate the at least one semiconductor element and a second end portion opposite the first end portion;
   a plate-like mount for supporting the at least one semiconductor element;
   a plurality of plate-like conductor elements adjacent to and spaced apart from edges of the plate-like mount and electrically connected to the power source terminals, the plate-like conductor elements attached to the first end portions of the second leads and being substantially wider than the second leads, the plate-like conductor elements parallel to and electrically insulated from the first leads; and
   a resin portion encapsulating the at least one semiconductor element, the plate-like mount, the plate-like conductor elements, and the first leads and the second leads except for the second end portions of the first and second leads.

2. The device according to claim 1, wherein the plate-like conductor elements include means for controlling a density of current flowing in the conductor elements and the second leads.

3. A resin encapsulation type semiconductor device, comprising:
   at least one semiconductor element having a surface and a plurality of signal terminals and a plurality of power source terminals on the surface;
   a plurality of first leads electrically connected to the signal terminals of the at least one semiconductor element, each first lead having a first end portion parallel to the surface of the at least one semiconductor element and a second end portion opposite the first end portion;
   a plurality of plate-like conductor elements electrically connected to the power source terminals of the at least one semiconductor element, the plate-like conductor elements parallel to and electrically insulated from the first leads and having control means for controlling a current density in the plate-like conductor elements;
   a plurality of second leads, each second lead electrically connected to the plate-like conductor elements and having a first end portion proximate the at least one semiconductor element and a second end portion opposite the first end portion; and
   a resin portion encapsulating the at least one semiconductor element, the plate-like conductor elements, and the first and second leads except for the second end portions of the first and second leads.

4. The device according to claim 3, wherein the second end portions of the first and second leads extend from the resin portion and are flush with each other.

5. The device according to claim 3, wherein the control means includes a plurality of triangular through-holes in the plate-like conductor elements.

6. The device according to claim 3, further including at least one plate-like mount for supporting the at least one semiconductor element.

7. The device according to claim 3, wherein the signal terminals of the at least one semiconductor element and the first leads are electrically connected together by bumps and the power source terminals of the at least one semiconductor element and the plate-like conductor elements are electrically connected together by bumps.

8. A resin encapsulation type semiconductor device, comprising:
- at least one semiconductor element having a surface and a plurality of signal terminals and a plurality of power source terminals on the surface;
- a plurality of first leads electrically connected to the signal terminals of the at least one semiconductor element, each first lead having a first end portion parallel to the surface of the at least one semiconductor element and a second end portion opposite the first end portion;
- a plurality of plate-like conductor elements having means, including a plurality of triangular through-holes, for controlling a current density in the plate-like conductor elements and electrically connected to the power source terminals of the at least one semiconductor element, the plate-like conductor elements parallel to and electrically insulated from the first leads;
- a plurality of second leads, each second lead electrically connected to the plate-like conductor elements and having a first end portion proximate the at least one semiconductor element and a second end portion opposite the first end portion; and
- a resin portion encapsulating the at least one semiconductor element, the plate-like conductor elements, and the first and second leads except for the second end portions of the first and second leads.

9. The device according to claim 8, further including at least one plate-like mount for supporting the at least one semiconductor element.

10. The device according to claim 8, wherein the signal terminals of the at least one semiconductor element and the first leads are electrically connected together by bumps and the power source terminals of the at least one semiconductor element and the plate-like conductor elements are electrically connected together by bumps.

11. The device according to claim 8, wherein the triangular through-holes are arranged in the plate-like conductor elements to provide a plurality of non-linear current paths for current flow in the plate-like conductor elements.

12. A resin encapsulation type semiconductor device, comprising:
- a plurality of semiconductor elements, each having a surface and a plurality of signal terminals and a plurality of power source terminals on the surface;
- a plurality of plate-like mounts, each supporting a different one of the semiconductor elements, the plate-like mounts spaced apart from one another to isolate the semiconductor elements from one another;
- a plurality of first leads electrically connected to the signal terminals of each of the semiconductor elements, at least a portion of the first leads parallel to the surface of the semiconductor elements;
- a plurality of plate-like conductor elements electrically connected to the power source terminals of the semiconductor elements and having means, including triangular through-holes, for controlling a current density in the plate-like conductor elements, the plate-like conductor elements parallel to and electrically insulated from the first leads;
- a plurality of second leads, each second lead electrically connected to a different one of the plate-like conductor elements; and
- a resin portion encapsulating the semiconductor elements, the plate-like mounts, the plate-like conductor elements, and a portion of each of the first and second leads.

13. The device according to claim 12, wherein the triangular through-holes are arranged in the plate-like conductor elements to provide a plurality of non-linear current paths for current flow in the plate-like conductor elements.

* * * * *